United States Patent
Maeda et al.

(10) Patent No.: US 11,079,643 B2
(45) Date of Patent: Aug. 3, 2021

(54) ACTIVE MATRIX SUBSTRATE AND LIQUID CRYSTAL DISPLAY DEVICE WITH TOUCH SENSOR

(71) Applicant: Sharp Kabushiki Kaisha, Sakai (JP)

(72) Inventors: Masaki Maeda, Sakai (JP); Tohru Daitoh, Sakai (JP); Hajime Imai, Sakai (JP); Yoshihito Hara, Sakai (JP); Hideki Kitagawa, Sakai (JP); Tatsuya Kawasaki, Sakai (JP); Teruyuki Ueda, Sakai (JP); Yoshiharu Hirata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/891,257

(22) Filed: Jun. 3, 2020

(65) Prior Publication Data

US 2020/0387019 A1    Dec. 10, 2020

Related U.S. Application Data

(60) Provisional application No. 62/858,350, filed on Jun. 7, 2019.

(51) Int. Cl.
| | |
|---|---|
| G02F 1/1333 | (2006.01) |
| G02F 1/1362 | (2006.01) |
| H01L 27/12 | (2006.01) |
| G06F 3/041 | (2006.01) |
| G02F 1/1368 | (2006.01) |

(52) U.S. Cl.
CPC ........ *G02F 1/1368* (2013.01); *G02F 1/13338* (2013.01); *G02F 1/136209* (2013.01); *G02F 1/136286* (2013.01); *G06F 3/0412* (2013.01); *H01L 27/124* (2013.01);
(Continued)

(58) Field of Classification Search
CPC ............... G02F 1/1368; G02F 1/13338; G02F 1/134363; G02F 2201/121; G02F 2201/123; G02F 1/136209; G02F 1/136286; G06F 3/0412; H01L 27/1225; H01L 27/124; H01L 27/1248
See application file for complete search history.

(56) References Cited

U.S. PATENT DOCUMENTS

| | | | |
|---|---|---|---|
| 2018/0292693 A1* | 10/2018 | Tsai | G06F 3/0416 |
| 2018/0314120 A1* | 11/2018 | Peng | G06F 3/0412 |
| 2019/0196638 A1 | 6/2019 | Tominaga et al. | |

FOREIGN PATENT DOCUMENTS

WO    2017/213173 A1    12/2017

* cited by examiner

*Primary Examiner* — Xuemei Zheng
(74) *Attorney, Agent, or Firm* — Keating & Bennett, LLP

(57) ABSTRACT

An active matrix substrate includes: a source metal layer including a plurality of source bus lines; a lower insulating layer covering the source metal layer; a oxide semiconductor TFT including an oxide semiconductor layer provided on the lower insulating layer; an inter-layer insulating layer covering the oxide semiconductor TFT; a pixel electrode provided on the inter-layer insulating layer; a common electrode including a plurality of sub common electrodes each of which is capable of functioning as a touch sensor electrode; a gate metal layer including a plurality of gate bus lines and a gate electrode; a drain metal layer including the drain electrode; and a plurality of touch sensor lines included in the drain metal layer and each electrically connected to any one of the sub common electrodes.

18 Claims, 8 Drawing Sheets

(52) U.S. Cl.
CPC ...... *H01L 27/1225* (2013.01); *H01L 27/1248* (2013.01); *G02F 2201/121* (2013.01); *G02F 2201/123* (2013.01)

ACTIVE MATRIX SUBSTRATE AND LIQUID CRYSTAL DISPLAY DEVICE WITH TOUCH SENSOR

CROSS-REFERENCE TO RELATED APPLICATION

The present application claims priority from Provisional Application No. 62/858,350, the content to which is hereby incorporated by reference into this application.

BACKGROUND OF THE INVENTION

1. Field of the Invention

The present invention relates to an active matrix substrate. The present invention also relates to a liquid crystal display (LED) device including the active matrix substrate and having a touch sensor.

2. Description of the Related Art

Recent display devices (hereinafter referred to as "touch panels") including touch sensors are widely used for such appliances as smartphones and tablet mobile terminals. Touch sensors known in the art include various kinds of touch sensors such as resistive touch sensors, capacitive touch sensors, and optical touch sensors. A capacitive touch sensor electrically detects a variation in capacitance due to a contact or an approach of an object (e.g., a finger) to determine whether the touch has occurred.

The capacitive touch sensor includes a self-capacitive touch sensor, and a mutual capacitive touch sensor. The self-capacitive touch sensor detects a variation in capacitance which occurs between an electrode for the touch sensor and an object (e.g., a finger). The mutual capacitive touch sensor generates an electric field, using a pair of electrodes (a transmitter electrode and a receiver electrode) for the touch sensor to detect a variation in the electric field between the electrodes.

Moreover, the touch panels include an add-on touch panel (in which touch sensors are arranged, toward a viewer, on a polarizer plate disposed toward the viewer), and an embedded touch panel. The embedded touch panel includes an on-cell touch panel and an in-cell touch panel. Here, the term cell means a display cell (hereinafter referred to as a "display panel"). For example, an LCD panel includes: an active matrix substrate (a thin-film transistor substrate, or a TFT substrate); and a counter substrate, wherein the TFT substrate and the counter substrate are arranged across a liquid crystal layer from each other. The LCD panel does not include a polarizer plate. In the "in-cell" touch panel, the display panel includes therein a layer functioning as a touch panel. Whereas, in the "on-cell" touch panel, a layer functioning as a touch panel is provided between the display panel and the polarizer plate (e.g., between the counter substrate and the polarizer plate). There is also a "hybrid" touch panel in which layers functioning as touch panels are each provided (i) in the display panel, and (ii) between the display panel and the polarizer plate. The embedded touch panel is more advantageous than the add-on touch panel in view of reduction in thickness and weight, as well as enhancement in light transmittance.

PCT International Application Publication No. WO2017/213173 discloses an embedded touch panel using an LCD panel utilizing a fringe field switching (FFS) mode; that is, a kind of a lateral electric field mode. The embedded touch panel includes a common electrode provided to an active matrix substrate to be used as an electrode for a touch sensor.

SUMMARY OF THE INVENTION

A lateral-electric-field-mode LCD panel with a touch sensor includes an active matrix substrate whose display area is provided with: a TFT and a pixel electrode disposed to each of the pixels; a common electrode to be also used as an electrode for the touch sensor (hereinafter referred to as a "sensor electrode"); and a line (hereinafter collectively referred to as a "touch sensor line") for driving the touch sensor and/or for allowing for detection by the touch sensor. Hence, the LCD panel in PCT International Application Publication No. WO2017/213173 requires more touch sensor lines and insulating layers covering the touch sensor lines than a conventional LCD panel of a lateral electric field mode does. Hence, more photomasks are inevitably required to produce the LDC panel in PCT International Application Publication No. WO2017/213173.

For example, a typical FFS-mode LCD includes an inter-layer insulating layer covering a TFT, a common electrode, a dielectric layer and a pixel electrode stacked on top of one another in the stated order. In this configuration, if a touch sensor line is provided between the inter-layer insulating layer and the common electrode, the inter-layer insulating layer, the touch sensor line, the insulating layer, the common electrode, the dielectric layer, and the pixel electrode are to be stacked on top of one another in the stated order. Hence, additionally required are a photomask for patterning a conductive film acting as the touch sensor line, and a photomask for patterning the dielectric layer covering the touch sensor line. Specifically, extra two photomasks are inevitably required for the production of the LCD panel.

In view of the above problem, an embodiment of the present invention is intended to provide an active matrix substrate including a touch sensor line. In producing the active matrix substrate, an increase in the number of photomasks to be required is curbed. The embodiment of the present invention can also provide a liquid crystal display device including such an active matrix substrate and having a touch sensor. This Specification discloses an active matrix substrate and a liquid crystal display device with a touch sensor recited in the items below.

[Item 1]
An active matrix substrate includes a plurality of pixel regions. The active matrix substrate includes:
  a substrate;
  a source metal layer provided on the substrate and including a plurality of source bus lines;
  a lower insulating layer covering the source metal layer;
  an oxide semiconductor TFT provided to each of the pixel regions, and including:
    an oxide semiconductor layer provided on the lower insulating layer; a gate insulating layer provided on the oxide semiconductor layer; a gate electrode provided across the gate insulating layer from the oxide semiconductor layer; and a source electrode and a drain electrode electrically connected to the oxide semiconductor layer,
  an inter-layer insulating layer covering the oxide semiconductor TFT;
  a pixel electrode provided on the inter-layer insulating layer and electrically connected to the drain electrode;
  a common electrode provided across a dielectric layer from the pixel electrode, and including a plurality of sub common electrodes each of which is capable of functioning as a touch sensor electrode;

a gate metal layer including a plurality of gate bus lines and the gate electrode;

a drain metal layer including the drain electrode; and a plurality of touch sensor lines included in the drain metal layer and each electrically connected to any one of the sub common electrodes.

[Item 2]

As to the active matrix substrate according to Item 1, the dielectric layer is provided on the pixel electrode, and the common electrode is provided on the dielectric layer.

[Item 3]

As to the active matrix substrate according to item 2, each of the touch sensor lines is connected to a corresponding one of the sub common electrodes through a contact hole formed in the dielectric layer and the inter-layer insulating layer.

[Item 4]

As to the active matrix substrate according to any one of Items 1 to 3, the active matrix substrate further includes an upper insulating layer covering the oxide semiconductor layer and the gate metal layer, wherein the touch sensor lines are provided on the upper insulating layer.

[Item 5]

As to the active matrix substrate according to any one of claims 1 to 4, each of the touch sensor lines overlaps with any one of the source bus lines when observed in a normal direction of the substrate.

[Item 6]

As to the active matrix substrate according to any one of Items 1 to 5, the source electrode included in the oxide semiconductor TFT is integrally formed with any one of the source bus lines.

[Item 7]

As to the active matrix substrate according to any one of Items 1 to 6, the source metal layer includes a light-blocking layer overlapping with a channel region of the oxide semiconductor layer when observed in a normal direction of the substrate.

[Item 8]

As to the active matrix substrate according to any one of claims 1 to 7, the oxide semiconductor layer includes an In—Ga—Zn—O-based semiconductor.

[Item 9]

As to the active matrix substrate according to Item 8, the In—Ga—Zn—O-based semiconductor includes a crystalline substance.

[Item 10]

A liquid crystal display device is provided with a touch sensor. The liquid crystal display device includes: the active matrix substrate according to any one of Items 1 to 9;

a counter substrate facing the active matrix substrate; and a liquid crystal layer provided between the active matrix substrate and the counter substrate.

Advantageous Effects of Invention

An embodiment of the present invention can provide an active matrix substrate including a touch sensor line. In producing the active matrix substrate, an increase in the number of photomasks to be required is curbed. The embodiment of the present invention can also provide a liquid crystal display device including such an active matrix substrate and having a touch sensor.

DETAILED DESCRIPTION OF THE INVENTION

Figure 1:
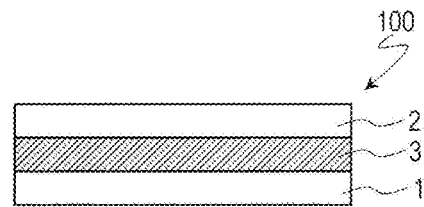
FIG. 1 schematically illustrates a cross-section of a liquid crystal display device (a touch panel) 100 with a touch sensor according to an embodiment of the present invention.

Described below is an embodiment of the present invention with reference to the drawings. It is to be noted that like reference numerals designate constituent features with substantially identical functions throughout the drawings. Hence, the descriptions of such reference numerals may be omitted. Moreover, for the sake of simplicity, configurations illustrated in the drawings below may be simplified or schematic ones. Some of the constituent features may be omitted. Dimensional ratios among constituent features in the drawings are not necessarily actual ones.

With reference to FIG. 1, described below is an LCD device (a touch panel) 100 with a touch sensor according to an embodiment of the present invention. FIG. 1 is a cross-section schematically illustrating the touch panel 100.

The touch panel 100 illustrated in FIG. 1 includes: an active matrix substrate (hereinafter referred to as a "TFT substrate") 1; a counter substrate (also referred to as a "color filter substrate") 2 facing the TFT substrate 1; and a liquid crystal layer 3 provided between the TFT substrate 1 and the counter substrate 2. Although not shown, the counter substrate 2 typically includes a color filter. Moreover, the touch panel 100 includes a not-shown backlight (an illumination device) to a back face of the TFT substrate 1.

The touch panel 100 is capable of displaying an image. Furthermore, the touch panel 100 is capable of detecting a position (a touch position), on the displayed image, touched by a user. The touch panel 100 is a so-called an in-cell touch panel.

The touch panel 100 displays an image in a lateral electric field mode (more specifically, an FFS mode). The TFT substrate 1 includes a pixel electrode and a common electrode (a counter electrode) for applying a lateral electric field (a fringe electric field) to the liquid crystal layer 3.

Figure 2:
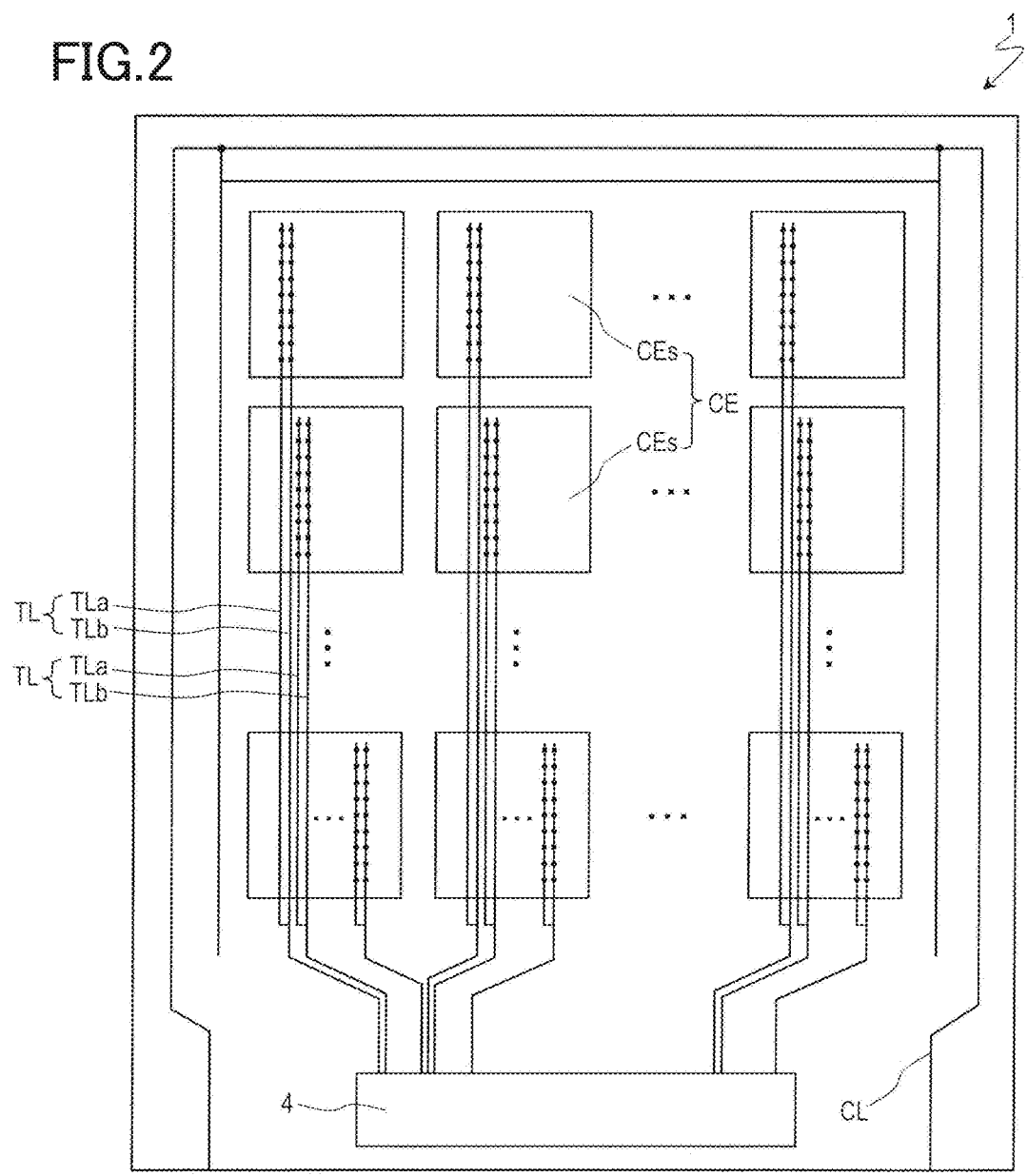
FIG. 2 illustrates an example of a common electrode CE disposed on an active matrix substrate (a TFT substrate) 1 included in the touch panel 100.

FIG. 2 illustrates an example of a common electrode CE disposed on the TFT substrate 1. As illustrated in FIG. 2, the common electrode CE includes a plurality of sub common electrodes CEs each of which is capable of functioning as a touch sensor electrode. The sub common electrodes CEs are arranged in a matrix. In the illustrated example, each of the sub common electrodes CEs is substantially rectangular. Although not shown, the TFT substrate 1 includes a plurality of pixel regions arranged in a matrix. Each of the sub common electrodes CEs corresponds to two or more pixel regions.

The common electrode CE including the sub common electrodes CEs is electrically connected to a common voltage line CL. When an image is displayed, the common electrode CE is supplied with a common voltage from the common voltage line CL.

The TFT substrate 1 further includes: a plurality of touch sensor lines (hereinafter referred to as "touch lines") TL; and a controller 4.

The controller 4 controls image display. Moreover, the controller 4 also controls detection of a touch position.

The touch lines TL are electrically connected to the controller 4. Moreover, each of the touch lines TL is electrically connected to any one of (a corresponding one of) the sub common electrodes CEs. The black dots in FIG. 2 denote connections between the touch lines TL and the sub common electrodes CEs.

A parasitic capacitance is created between any given sub common electrode CEs and another sub common electrode CEs. When such an object as a finger of a person touches a display screen of the touch panel 100, a capacitance is created between the finger and the display screen, increasing a capacitance between the sub common electrodes CEs in a touch position.

In detecting the touch position, the controller 4 supplies through the touch lines TL the sub common electrodes CEs with a touch drive signal for detecting the touch position, and receives through the touch lines TL a touch detection signal through a touch line TL. Such features allows for detecting a variation in the capacitance between the sub common electrodes CEs, thereby detecting the touch position. That is, the touch lines TL function as lines for transmitting and receiving the touch drive signal and the touch detection signal.

FIG. 2 illustrates, as an example, a configuration in which each touch line TL includes two branch lines TLa and TLb. Each of the two branch lines TLa and TLb is electrically connected to a corresponding sub common electrode CEs. Such a redundant configuration makes it possible to prevent a failure in detection due to a broken touch line TL. Note that the touch lines TL do not have to have the redundant configuration.

Figure 3:
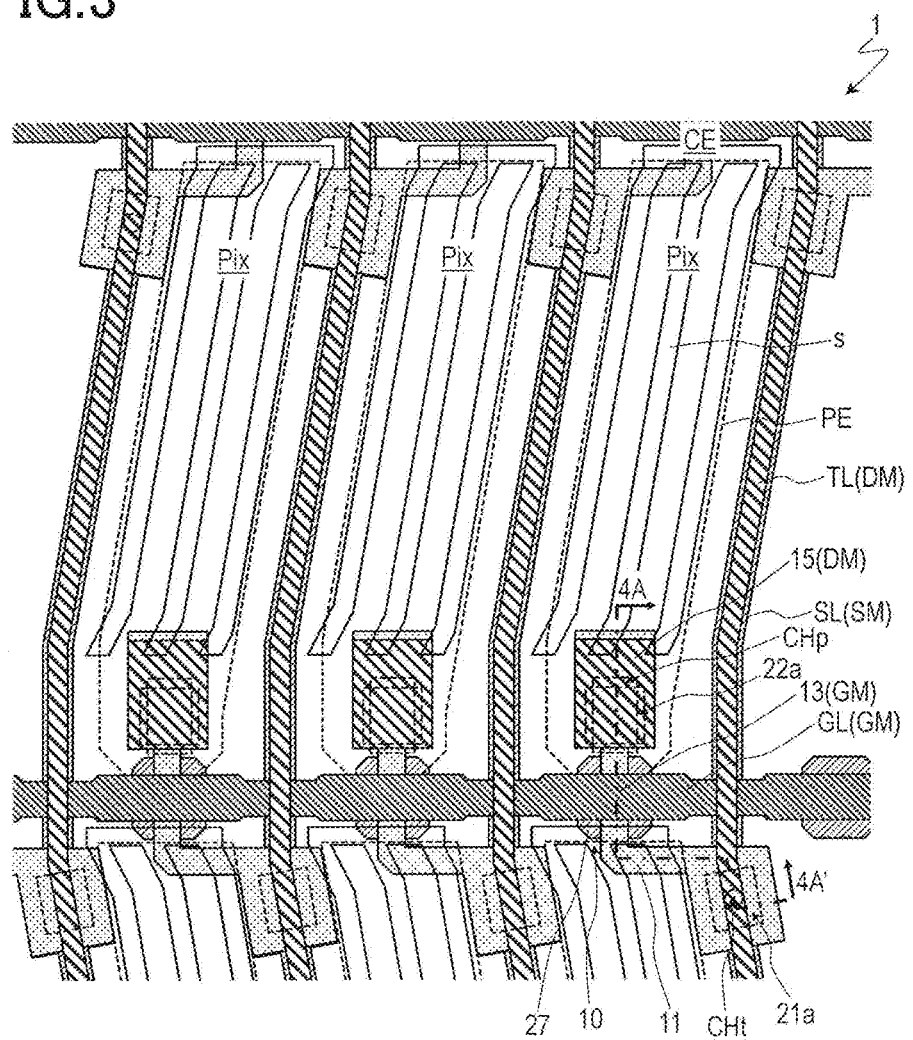
FIG. 3 schematically illustrates a plan view of the TFT substrate 1, the plan view illustrating three of pixel regions Pix in the TFT substrate 1.
Figure 4:
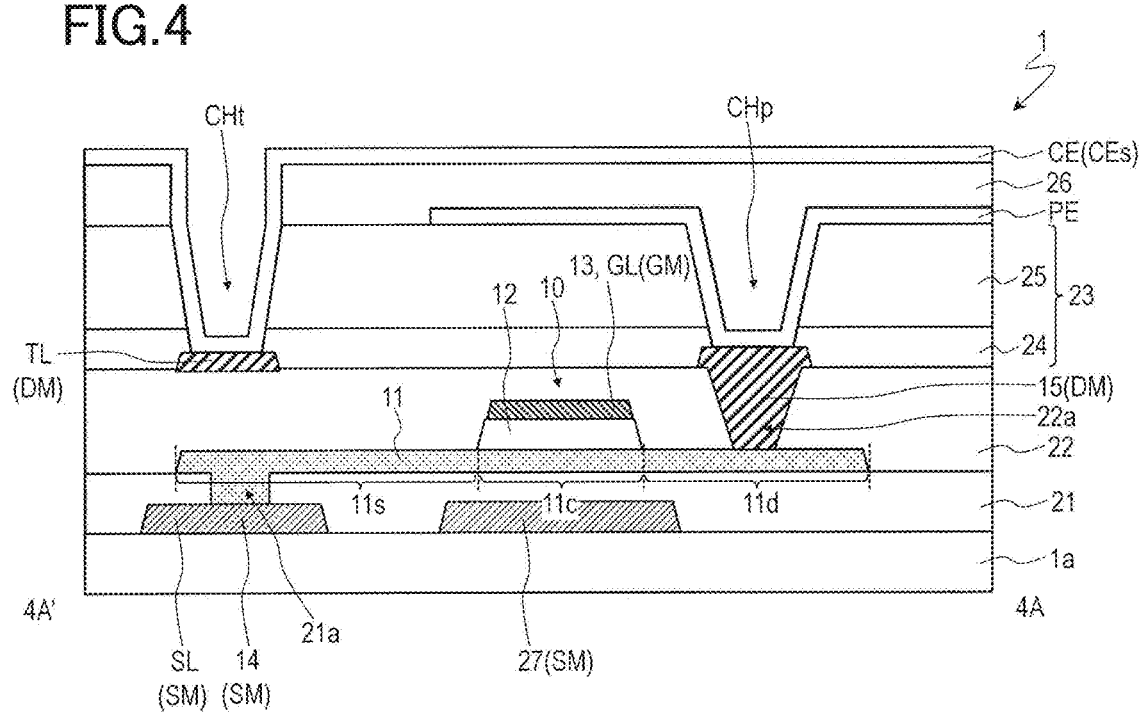
FIG. 4 schematically illustrates a cross-section of the TFT substrate 1, taken from line 4A-4A' in FIG. 3.

With reference to FIGS. 3 and 4, a specific configuration of the TFT substrate 1 is described. FIG. 3 is a schematic plan view of the TFT substrate 1. FIG. 4 is a schematic cross-section of the TFT substrate 1. FIG. 3 illustrates three of pixel regions Pix. FIG. 4 illustrates a cross-section taken from line 4A-4A' in FIG. 3.

The TFT substrate 1 illustrated in FIG. 3 includes the pixel regions Pix arranged in a matrix with rows and columns. Each of the pixel regions Pix in the TFT substrate 1 corresponds to one of the pixels of the touch panel 100. The pixel region Pix may also be simply referred to as a "pixel."

The TFT substrate 1 illustrated in FIGS. 3 and 4 includes: a substrate 1a; a plurality of gate bus lines GL provided above the substrate 1a; and a plurality of source bus lines SL provided on the substrate 1a. The substrate 1a is transparent and insulating. The substrate 1a is, for example, a glass substrate or a plastic substrate. The gate bus lines GL extend along the rows. The source bus lines SL extend along the columns.

The gate bus lines GL are each patterned on a gate conductive film (a gate metal film). Lines and/or electrodes patterned on the gate metal film are collectively referred to as a gate metal layer GM. The source bus lines SL are each patterned on a source conductive film (a source metal film). Lines and/or electrodes patterned on the source metal film are collectively referred to as a source metal layer SM. The source metal layer SM is positioned below (c.f., close to) the gate metal layer GM. A lower insulating layer 21 is provided to cover the source metal layer SM.

The TFT substrate 1 further includes: an oxide semiconductor TFT (hereinafter simply referred also to as a "TFT") 10; a pixel electrode PE; and the common electrode CE provided across a dielectric layer 26 from the pixel electrode PE. Here, the TFT 10 and the pixel electrode PE are provided to each of the pixel regions Pix. The common electrode CE includes at least one slit "s" (not shown in FIG. 4) for each pixel region. Note that the number and shape of the slits "s" shall not be limited to an example illustrated in FIG. 4.

The TFT 10 is a top gate transistor. The TFT 10 includes: an oxide semiconductor layer 11; a gate insulating layer 12; a gate electrode 13; a source electrode 14; and a drain electrode 15.

The oxide semiconductor layer 11 is provided on the lower insulating layer 21. The gate insulating layer 12 is provided on the oxide semiconductor layer 11, more specifically on a portion of the oxide semiconductor layer 11. The gate electrode 13 is provided across the gate insulating layer 12 from the oxide semiconductor layer 11. The source electrode 14 and the drain electrode 15 are electrically connected to the oxide semiconductor layer 11.

The oxide semiconductor layer 11 includes: a channel region 11c overlapping with the gate electrode 13 when observed in the normal direction of the substrate 1a; and a first region 11s and a second region 11d each provided to either side of the channel region 11c. The first region 11s and the second region 11d can be a low resistivity region lower in resistivity than the channel region 11c.

The source electrode 14 is electrically connected to the source bus line SL. In an illustrated example, the source electrode 14 is integrally formed with the source bus line SL. More specifically, a portion of the source bus line SL functions as the source electrode 14. That is, the source electrode 14 is included in the source metal layer SM. Note that the source electrode 14 may extend from the source bus line SL, such that the source electrode 14 and the source bus line SM extend in different directions.

The lower insulating layer 21 includes an opening 21a formed to expose the source electrode 14. Through the opening 21a, the first region 11s of the oxide semiconductor layer 11 is connected to the source electrode 14.

The gate electrode 13 is electrically connected to the gate bus line GL. In an illustrated example, the gate electrode 13 is integrally formed with the gate bus line GL. More specifically, a portion of the gate bus line GL functions as the gate electrode 13. That is, the gate electrode 13 is included in the gate metal layer GM. Note that the gate electrode 13 may extend from the gate bus line GL, such that the gate electrode 13 and the gate bus line GL extend in different directions.

An upper insulating layer 22 is provided to cover the oxide semiconductor layer 11 and the gate electrode 13 (the gate metal layer GM). The upper insulating layer 22 includes an opening 22a formed to expose a portion of the second region 11d of the oxide semiconductor layer 11.

The drain electrode 15 is provided on the upper insulating layer 22, and connected to the second region 11d of the oxide semiconductor layer 11 through the opening 22a of the upper insulating layer 22. The drain electrode 15 is patterned on a drain conductive film (a drain metal film). Lines and/or electrodes patterned on the drain metal film are collectively referred to as a drain metal layer DM.

An inter-layer insulating layer 23 is provided to cover the TFT 10. In an illustrated example, the inter-layer insulating layer 23 is multi-layered to include: an inorganic insulating layer (a passivation film) 24; and an organic insulating layer (a planarization film) 25 provided on the inorganic insulating layer 24. Note that the inter-layer insulating layer 23 does not have to be multi-layered. The inter-layer insulating layer 23 includes a contact hole (hereinafter referred to as a "pixel contact hole") CHp formed to expose at least a portion of the drain electrode 15.

The pixel electrode PE is provided on the inter-layer insulating layer 23. The pixel electrode PE is electrically connected to the drain electrode 15. The pixel electrode PE is connected to the drain electrode 15 through the pixel contact hole CHp of the inter-layer insulating layer 23.

The dielectric layer 26 is provided on the pixel electrode PE. The common electrode CE including the sub common electrodes CEs is provided on the dielectric layer 26. That is, the common electrode CE is positioned above the pixel electrode PE.

A light-blocking layer 27 is provided close to the substrate 1a in relation to the oxide semiconductor layer 11 (i.e., provided below the oxide semiconductor layer 11). When observed in the normal direction of the substrate 1a, the light-blocking layer 27 overlaps with the channel region 11c of the oxide semiconductor layer 11. The light-blocking layer 27 is formed of the source metal film. That is, the light-blocking layer 27 is included in the source metal layer SM. The light-blocking layer 27 can reduce deterioration in properties of the TFT 10 caused by light from the backlight emitting the channel region 11c of the oxide semiconductor layer 11. The light-blocking layer 27 may either electrically float or have a constant potential (a fixed potential).

As can be seen, the TFT substrate 1 includes the touch lines TL. The touch lines TL illustrated in FIG. 4 are provided on the upper insulating layer 22, and formed of the drain metal film. That is, the touch lines TL are included in the drain metal layer DM.

Each of the touch lines TL is connected to a corresponding one of the sub common electrodes CEs through a contact hole (hereinafter referred to as a "touch line contact hole") CHt formed in the dielectric layer 26 and the inter-layer insulating layer 23. Each touch line TL may have at least one connection to the corresponding sub common electrode CEs. Alternatively, the touch line TL may have two or more connections to obtain redundancy.

When observed in the normal direction of the substrate 1a, each of the touch lines TL overlaps with any one of the source bus lines SL. That is, the touch lines TL extend in substantially the same direction as the source bus lines SL do.

Described here are an "upper source structure" and a "lower source structure."

A conventional top gate oxide semiconductor TFT typically includes a gate electrode on a portion of an oxide semiconductor layer through a gate insulating layer, and a source electrode, a drain electrode, and a source bus line are arranged on the insulating layer covering the gate electrode. That is, a source metal layer including, for example, the source bus line is positioned above a gate metal layer including the gate electrode. Hereinafter, such a structure is referred to as an "upper source structure."

Whereas, in the TFT substrate 1, the source metal layer SM is positioned below (i.e., close to the substrate 1a) the gate metal layer GM. Hereinafter, such a structure is referred to as a "lower source structure."

Figure 5:
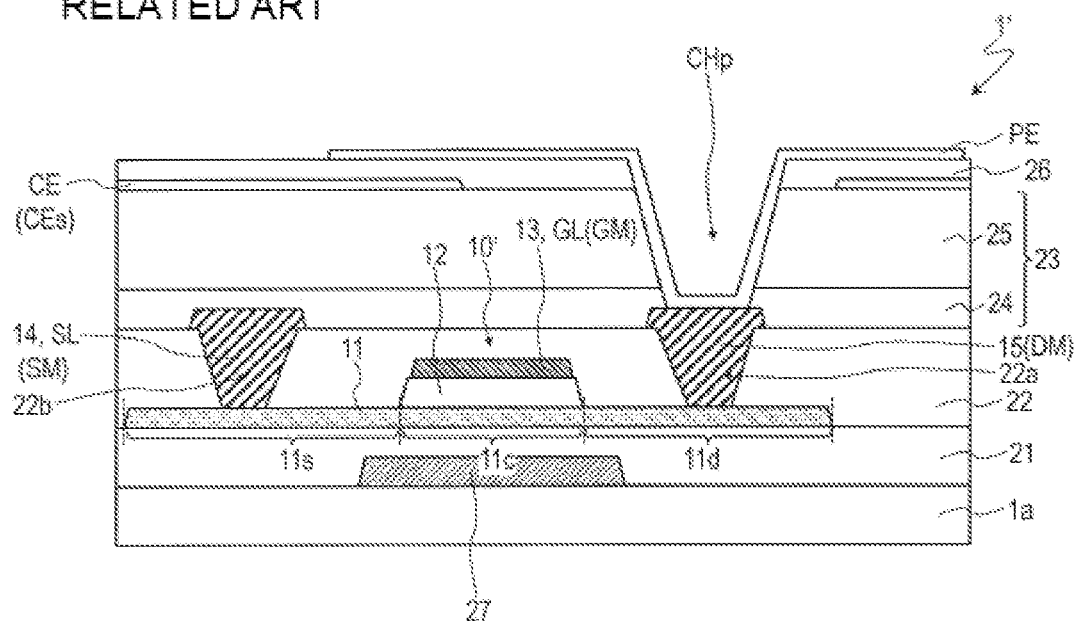
FIG. 5 illustrates a cross-section of a TFT substrate 1' including an upper source structure according to a comparative example.

FIG. 5 illustrates a TFT substrate 1', of a comparative example, including the upper source structure. As can be seen in the TFT substrate 1, the TFT substrate 1' of the comparative example includes a top gate TFT 10'. Note that, in the TFT substrate 1' of the comparative example, the source bus line SL and the source electrode 14 of the TFT 10' are provided on the upper insulating layer 22 together with the drain electrode 15. That is, the source metal layer SM formed on the upper insulating layer 22 includes the source line SL, the source electrode 14, and the drain electrode 15. The source electrode 14 is connected to the first region 11s of the oxide semiconductor layer 11 through the opening 22b formed in the upper insulating layer 22. Moreover, in the TFT substrate 1' of the comparative example, the pixel electrode PE is positioned above the common electrode CE.

Figure 6:
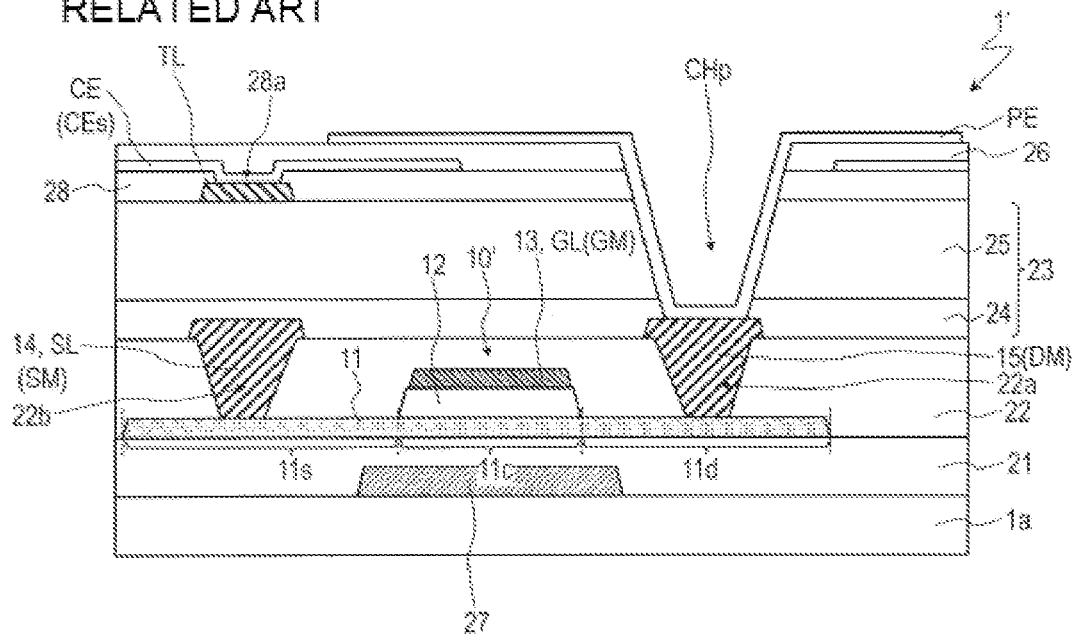
FIG. 6 illustrates the TFT substrate 1' of the comparative example, with a touch line TL provided on an inter-layer insulating layer 23.

FIG. 6 illustrates the TFT substrate 1' of the comparative example, with the touch line TL provided on the inter-layer insulating layer 23. In a configuration illustrated in FIG. 6, the inter-layer insulating layer 23, the touch line TL, the insulating layer 28 covering the touch line TL, the common electrode CE, the dielectric layer 26, and the pixel electrode PE are stacked on top of one another in the stated order. The touch line TL is connected to the common electrode CE through the opening 28a formed in the insulating layer 28. When the TFT substrate 1' is produced, the configuration illustrated in FIG. 6 additionally requires a photomask for patterning a touch line conductive film and a phtomask for patterning the insulating layer 28 covering the touch line TL. That is, extra two photomasks are inevitably required for the production of the TFT substrate 1'.

Whereas, in the TFT substrate 1 of the touch panel 100 according to the embodiment of the present invention, the touch line TL is included in the drain metal layer DM as described before. That is, the touch line TL is formed of the same conductive film (the drain metal film) as the drain electrode 15 is formed of. Such a feature makes it possible to provide the touch line TL without increasing the number of photomasks required for the production of the TFT substrate 1.

Moreover, the TFT substrate 1 has the lower source structure. With the light-blocking layer 27 provided to the TFT substrate 1, if the source bus line SL is formed of the same conductive film as the light-blocking layer 27 is formed (i.e., if the light-blocking layer 27 is formed of the source metal film), there is no increase in the number of photomasks caused by adopting the lower source structure (i.e., caused by providing the source metal layer SM below the gate metal layer GM).

Note that the touch line TL could be formed of the same conductive film as the light-blocking layer 27 is. In this case, an aperture ratio might be smaller and development of the production process might be difficult. This is because such a technique inevitably increases the size of the contact hole for connecting the touch line TL formed in the same layer as the light-blocking layer 27 (i.e., the lower most layer) and the common electrode CE positioned in the upper most layer. In order to decrease the size of the contact hole, the contact hole could be designed to have a side face with a low angle taper (i.e., to have a steep side face). The design could cause such fears as a step disconnection and an increase in contact resistance.

Moreover, in the TFT substrate 1, the touch line TL is positioned in a lower portion of the inter-layer insulating layer 23. Compared with the configuration in FIG. 6 in which the touch line TL is positioned on the inter-layer insulating layer 23, the configuration in FIG. 4 can reduce the parasitic capacitance created between any given sub common electrode CEs and a touch line TL overlapping with, but not connected to (i.e., not corresponding to), the sub common electrode CEs. For example, in the configuration illustrated in FIG. 6, only the dielectric layer 26 is provided between the touch line TL and the sub common electrode CEs. However, in the TFT substrate 1, not only the dielectric layer 26 but also the inter-layer insulating layer 23 is provided between the touch line TL and the sub common electrode CEs. Such a feature makes it possible to improve sensing performance (sensitivity) of a touch sensor, facilitating to provide a touch sensor suitably operable with both of a finger and a stylus.

In view of increasing in aperture ratio, as illustrated in the example, each of the touch lines TL preferably overlaps with any one of the source bus lines SL when observed in the normal direction of the substrate 1a. Such a feature makes it possible to extend the touch lines TL to the peripheral circuitry without decreasing the pixel aperture ratio.

Described here is an example in which the common electrode CE is positioned above the pixel electrode PE. In contrast, the pixel electrode PE may be positioned above the common electrode CE. Note that, in view of improvement in sensitivity of a touch sensor, the common electrode CE is preferably positioned above the pixel electrode PE.

[Method for Producing TFT Substrate 1]

With reference to FIGS. 7A to 7K, described here is a method for producing the TFT substrate 1. FIGS. 7A to 7K illustrate cross-sections presenting steps for showing the method for manufacturing the TFT substrate 1.

Figure 7A:
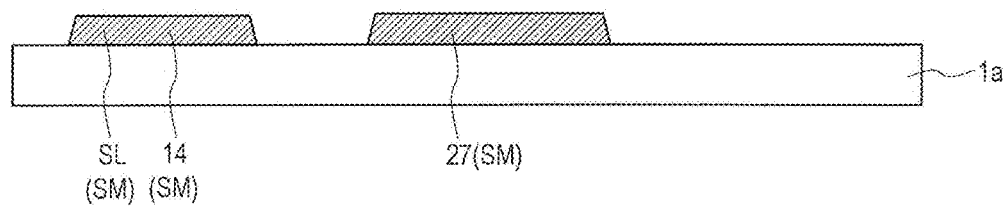
FIG. 7A illustrates a cross-section of a step for showing a method for producing the TFT substrate 1.

First, as illustrated in FIG. 7A, the source metal layer SM including the source electrode 14, the source bus line SL, and the light-blocking layer 27 is formed on the substrate 1a. Specifically, first, a source conductive film (a source metal film) is formed on the substrate 1a and patterned by photolithography to form the source metal layer SM.

Examples of the substrate 1a can include a glass substrate, a silicon substrate, and a heat-resistant plastic substrate (a resin substrate).

An example of the source metal film to be used is, but not limited to, a metal film including an element selected from among aluminum (Al), chromium (Cr), copper (Cu) tantalum (Ta), titanium (Ti), molybdenum (Mo), or tungsten (W), or an alloy film including these elements as components. Moreover, the source metal film may be a multi-layered film including two or more of these films. An example of the multi-layered film may include a three-layered film of a titanium film, an aluminum film, and a titanium film, or a three-layered film of a molybdenum film, an aluminum film, and a molybdenum film. Note that the source metal film shall not be limited to the three-layered film. Alternatively, the source metal film may be a single-layered film, a double-layered film, or a quadruple-layered film. Here, used as the source metal film is a multi-layered film including a Ti film (thickness: 15 to 70 nm) as a lower layer and a Cu film (thickness: 200 to 500 nm) as an upper layer.

Figure 7B:
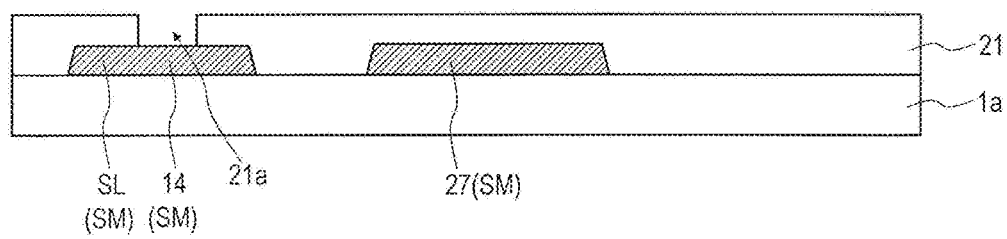
FIG. 7B illustrates a cross-section presenting a step for showing the method for producing the TFT substrate 1.

Next, as illustrated in FIG. 7B, the lower insulating layer 21 is formed to cover the source metal layer SM. An example of the lower insulating layer 21 to be appropriately used includes, for example, a silicon dioxide ($SiO_2$) layer, a silicon nitride (SiNx) layer, a silicon oxide nitride (SiOxNy; x>y) layer, a silicon nitride oxide (SiNxOy; x>y) layer, an oxide aluminum layer, or an oxide tantalum layer. The lower insulating layer 21 may have a multi-layered structure. Here, using, for example, the chemical vapor deposition (CVD), a multi-layered film including a silicon nitride layer (thickness: 50 to 600 nm) as a lower layer, and a silicon oxide layer (thickness: 50 to 600 nm) is formed as the lower insulating layer 21. When an oxide film such as a silicon oxide film is used as the lower insulating layer 21 (as the upper most layer of the lower insulating layer 21 when the lower insulating layer 21 has a multi-layered structure), the oxide film can reduce oxidization defect which appears in the channel region 11c of the oxide semiconductor layer 11 to be formed later. Such a feature makes it possible to curb reduction in resistance of the channel region 11c. After the lower insulating layer 21 is formed, the lower insulating layer 21 is patterned by photolithography (e.g., by dry etching). Hence, the opening 21a is formed to expose the source electrode 14.

Figure 7C:
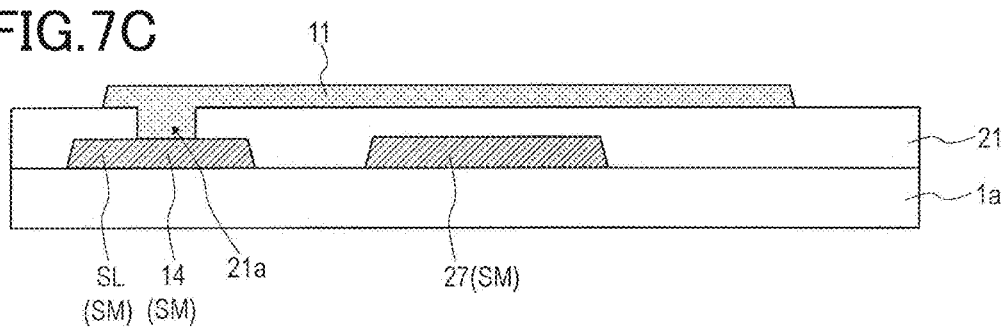
FIG. 7C illustrates a cross-section presenting a step for showing the method for producing the TFT substrate 1.

Then, as illustrated in FIG. 7C, the oxide semiconductor layer 11 is formed on the lower insulating layer 21. Specifically, first, an oxide semiconductor film is formed, for example, by sputtering. Then, the oxide semiconductor film is patterned by photolithography to form the oxide semiconductor layer 11. An example of the oxide semiconductor film may be, but not limited to, an In—Ga—Zn—O-based semiconductor film having a thickness of 15 to 200 nm inclusive.

Figure 7D:
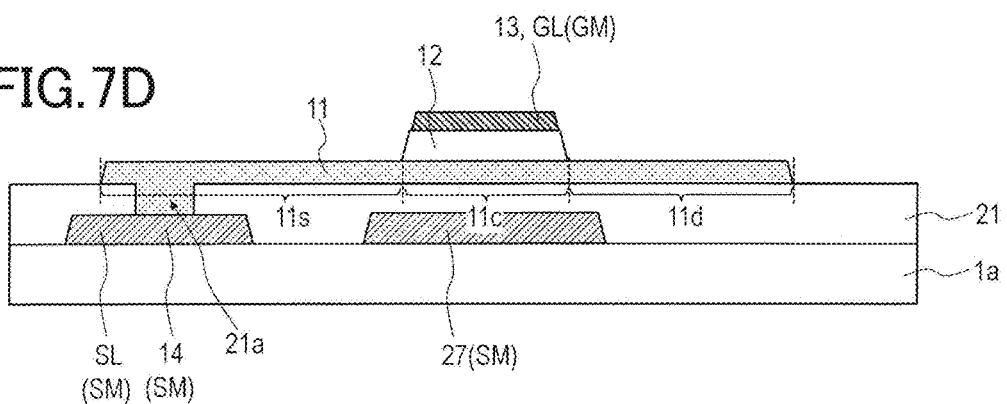
FIG. 7D illustrates a cross-section presenting a step for showing the method for producing the TFT substrate 1.

After that, as illustrated in FIG. 7D, the gate insulating layer 12 and the gate metal layer GM including the gate electrode 13 and the gate bus line GL are formed. Specifically, first, an insulating film and a gate conductive film (a gate metal film) are formed in the stated order to cover the oxide semiconductor layer 11. The insulating film may be formed by, for example, the CVD. The gate metal film may be formed by, for example, sputtering.

As the insulating film, the same insulating film as the lower insulating layer 21 (i.e., the insulating film described by an example as the lower insulating layer 21) can be used. When an oxide film such as a silicon oxide film is used as the insulating film, the oxide film can reduce oxidization defect which appears in the channel region 11c of the oxide semiconductor layer 11. Such a feature makes it possible to curb reduction in resistance of the channel region 11c. Here, used here as the insulating film is a silicon oxide film (thickness: 80 to 250 nm inclusive).

An example of the gate metal film to be used may be a metal film including an element selected from among, for example, aluminum (Al), chromium (Cr), copper (Cu) tantalum (Ta), titanium (Ti), molybdenum (Mo), or tungsten (W), or an alloy film including these elements as components. Moreover, the gate metal film may be a multi-layered film including two or more of these films. An example of the multi-layered film may include a three-layered film of a titanium film, an aluminum film, and a titanium film, or a three-layered film of a molybdenum film, an aluminum film, and a molybdenum film. Note that the gate metal film shall not be limited to the three-layered film. Alternatively, the gate metal film may be a single-layered film, a double-layered film, or a quadruple-layered film. Here, used as the gate metal film is a multi-layered film including a Ti film (thickness: 15 to 70 nm) as a lower layer and a Cu film (thickness: 200 to 500 nm) as an upper layer.

Next, the gate metal film is patterned with a resist mask to form the gate electrode 13 and the gate bus line GL. The gate metal film can be patterned by wet etching or by dry etching. After that, the insulating film is patterned with the same resist mask. Alternatively, the resist mask may be removed. Then, the insulating film may be patterned, using the gate electrode 13 as a mask. Hence, the gate insulating layer 12 is obtained. The insulating film can be patterned by, for example, dry etching.

In this step, the same mask is used to pattern the insulating film and the gate metal film, so that the side faces of the gate insulating film 12 and the gate electrode 13 conform to each other in a thickness direction. That is, when observed in the normal direction of the substrate 1a, the circumference of the gate insulating layer 12 conforms to that of the gate electrode 13. Note that the insulating film may be formed and patterned to form the gate insulating layer 12. Then, the gate metal film may be formed and patterned to form the gate electrode 13.

Next, the oxide semiconductor layer 11 is treated to have low resistivity. The low resistivity treatment is, for example, plasma treatment. Thanks to this low resistivity treatment, when observed in the normal direction of the substrate 1a, the first region 11s and the second region 11d, included in the oxide semiconductor layer 11 but not overlapping with the gate electrode 13 and the gate insulating layer 12, are low resistivity regions lower in resistivity than the channel region 11c overlapping with the gate electrode 13 and the gate insulating layer 12. The first region 11s and the second region 11d may be a conductor region (e.g., a sheet resistance of 200Ω/□ or below).

In the low resistivity treatment (the plasma treatment), a portion, included in the oxide semiconductor layer 11 but not covered with the gate electrode 13, may be exposed to reducing plasma or plasma including a doping element (e.g., argon plasma). Thanks to this exposure, the resistance decreases near the surface of the exposed portions 11s and 11d of the oxide semiconductor layer, so that the exposed portions 11s and 11d become the low resistivity regions. The portion 11c, of the oxide semiconductor layer 11, masked by the gate electrode 13 is left as a semiconductor region. Note that a technique and a condition of the low resistivity treatment are described in, for example, Japanese Unexamined Patent Application Publication No. 2008-40343. For reference, all the contents disclosed in Japanese Unexamined Patent Application Publication No. 2008-40343 are incorporated in this Specification.

Figure 7E:
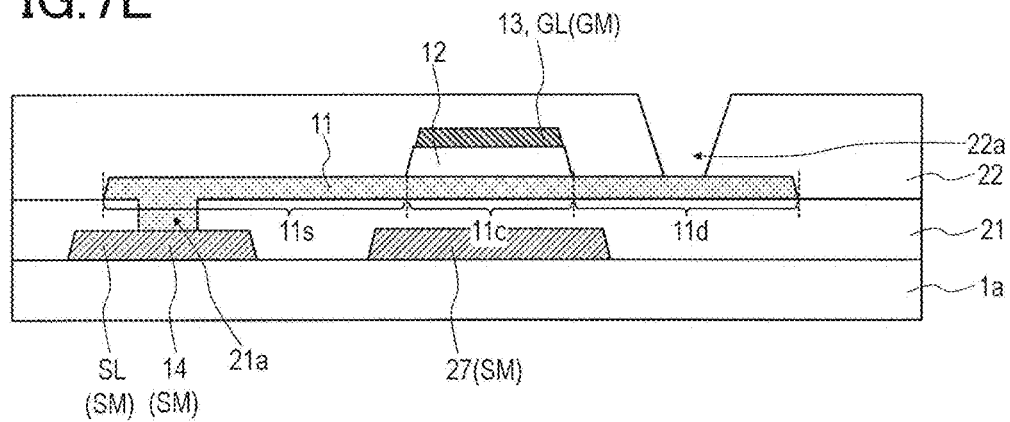
FIG. 7E illustrates a cross-section presenting a step for showing the method for producing the TFT substrate 1.

Next, as illustrated in FIG. 7E, the upper insulating layer 22 is formed to cover the oxide semiconductor layer 11 and the gate metal layer GM. As the upper insulating layer 22, an inorganic insulating layer such as a silicon oxide film, a silicon nitride film, a silicon oxide nitride film, and a silicon nitride oxide film can be used alone. Alternatively, the upper insulating layer 22 may include two or more of these films stacked one after another. The inorganic insulating layer has a thickness of, for example, 100 to 500 nm inclusive. Preferably, the upper insulating layer 22 is formed of an insulating film such as a silicon nitride film reducing the oxide semiconductor. This configuration can maintain low resistivity in a region, of the oxide semiconductor layer 11, making contact with the upper insulating layer 22 (here, the first region 11s and the second region 11d). Here, as the upper insulating layer 22, an SiNx layer (thickness: 300 nm) is formed by the CVD. After the upper insulating layer 22 is formed, the opening 22a is formed in the upper insulating layer 22 by, for example, dry etching to expose a portion of the second region 11d of the oxide semiconductor layer 11.

Figure 7F:
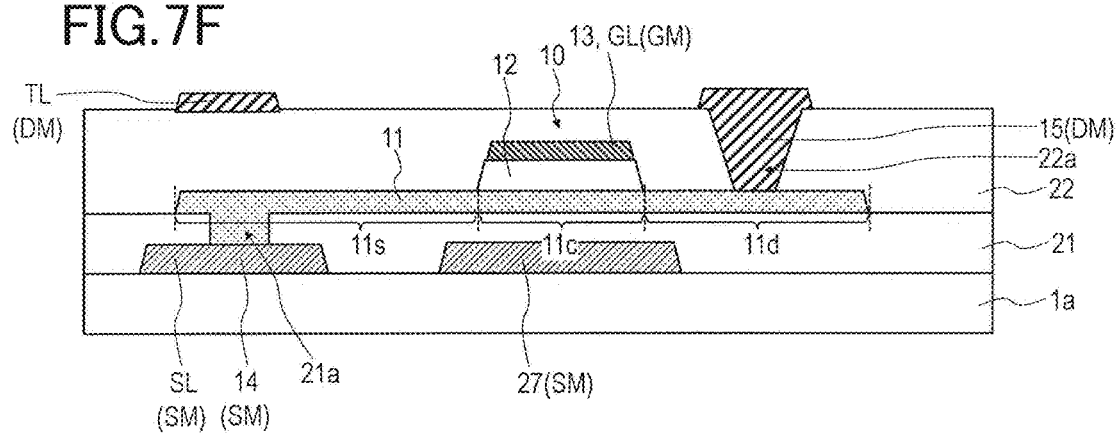
FIG. 7F illustrates a cross-section presenting a step for showing the method for producing the TFT substrate 1.

Then, as illustrated in FIG. 7F, the drain metal layer DM including the drain electrode 15 and the touch line TL is formed on the upper insulating layer 22. Specifically, first, a drain conductive film (a drain metal film) is formed on the upper insulating layer 11. After that, the drain metal film is patterned by photolithography to obtain the drain metal layer DM. The drain metal film is patterned by dry etching or wet etching. Thus, the TFT 10 is produced.

An example of the drain metal film includes an element selected from among aluminum (Al), chromium (Cr), copper (Cu) tantalum (Ta), titanium (Ti), molybdenum (Mo), or tungsten (W), or an alloy including these elements as components. An example of the drain metal film may include a three-layered film of a titanium film, an aluminum film, and a titanium film, or a three-layered film of a molybdenum film, an aluminum film, and a molybdenum film. Note that the drain metal film shall not be limited to the three-layered film. Alternatively, the drain metal film may be a single-layered film, a double-layered film, or a quadruple-layered film. Here, used as the drain metal film is a multi-layered film including a Ti film (thickness: 15 to 70 nm) as a lower layer and a Cu film (thickness: 200 to 500 nm) as an upper layer.

Figure 7G:
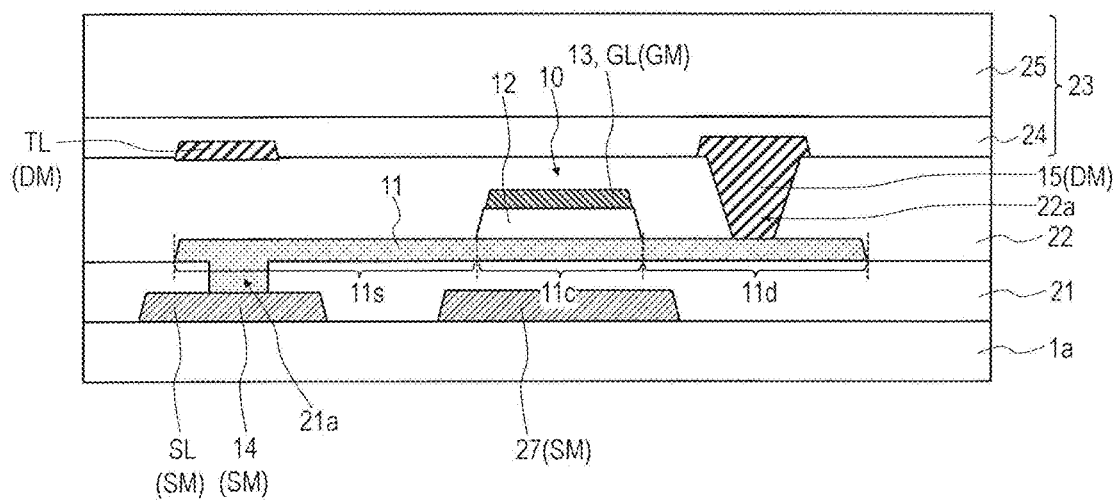
FIG. 7G illustrates a cross-section presenting a step for showing the method for producing the TFT substrate 1.

After that, as illustrated in FIG. 7G, the inter-layer insulating layer 23 is formed to cover the TFT 10. The inter-layer insulating layer 23 includes: the inorganic insulating layer 24 functioning as a passivation film; and the organic insulating layer 25 functioning as a planarization film 25. The inorganic insulating layer 24 may be made of the same material, described by an example, as the upper insulating layer 22 is made of. Here, as the inorganic insulating layer 24, an SiNx layer (thickness: 200 nm, for example) is formed by the CVD. The organic insulating layer 25 can be formed of, for example, a photosensitive resin material. The organic insulating layer 25 has a thickness of, for example, 1 to 3 μm, and preferably 2 to 3 μm.

Figure 7H:
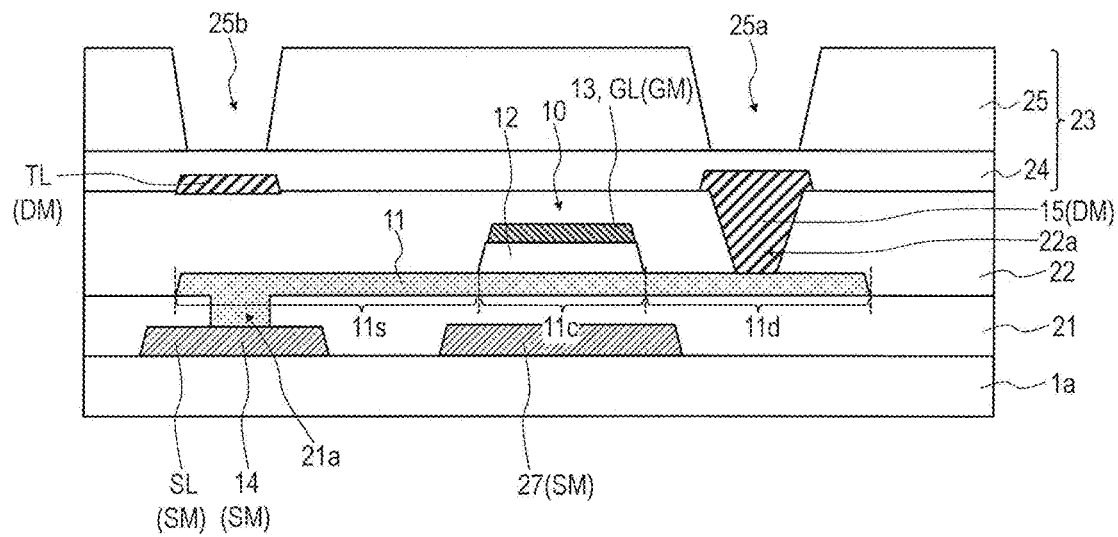
FIG. 7H illustrates a cross-section presenting a step for showing the method for producing the TFT substrate 1.
Figure 7I:
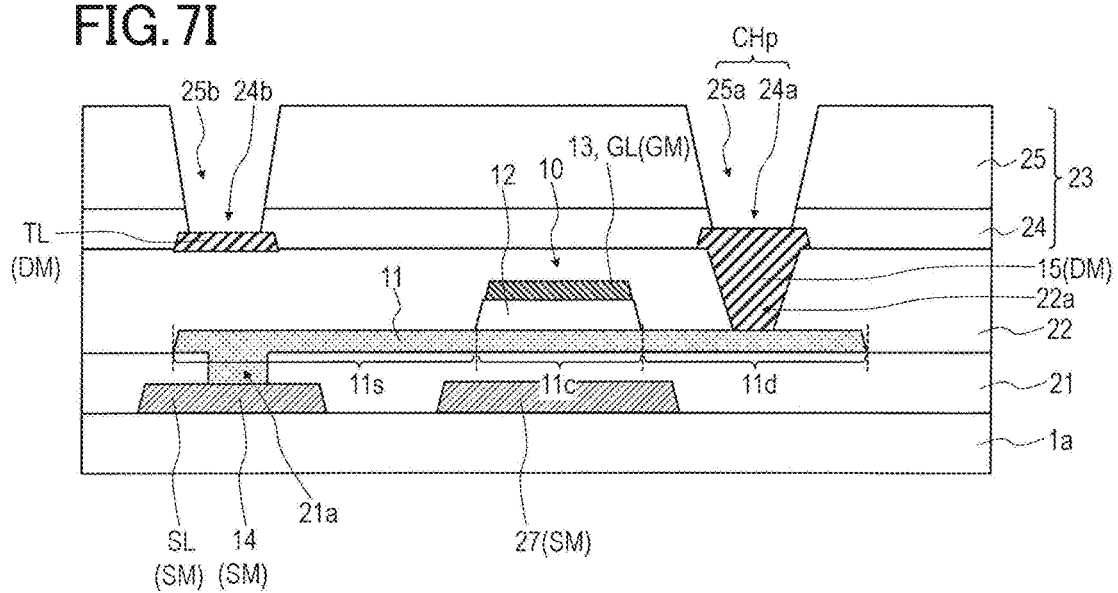
FIG. 7I illustrates a cross-section presenting a step for showing the method for producing the TFT substrate 1.

Next, as illustrated in FIG. 7H, the organic insulating layer 25 is patterned to form the first opening 25a overlapping with the drain electrode 15 and the second opening 25b overlapping with the touch line TL. Then, as illustrated in FIG. 7I, using the organic insulating layer 25 having the first opening 25a and the second opening 25b as a mask, the first opening 24a and the second opening 24b are formed on the inorganic insulating layer 24. The first opening 24a exposes the drain electrode 15, and the second opening 24b exposes the touch line TL. The first opening 25a of the organic insulating layer 25 and the first opening 24a of the inorganic insulating layer 24 constitute the pixel contact hole CHp. After the organic insulating layer 25 is patterned, another etching mask may be separately provided. Using the etching mask, the inorganic insulating layer 24 may be patterned to form the first opening 24a and the second opening 24b.

Figure 7J:
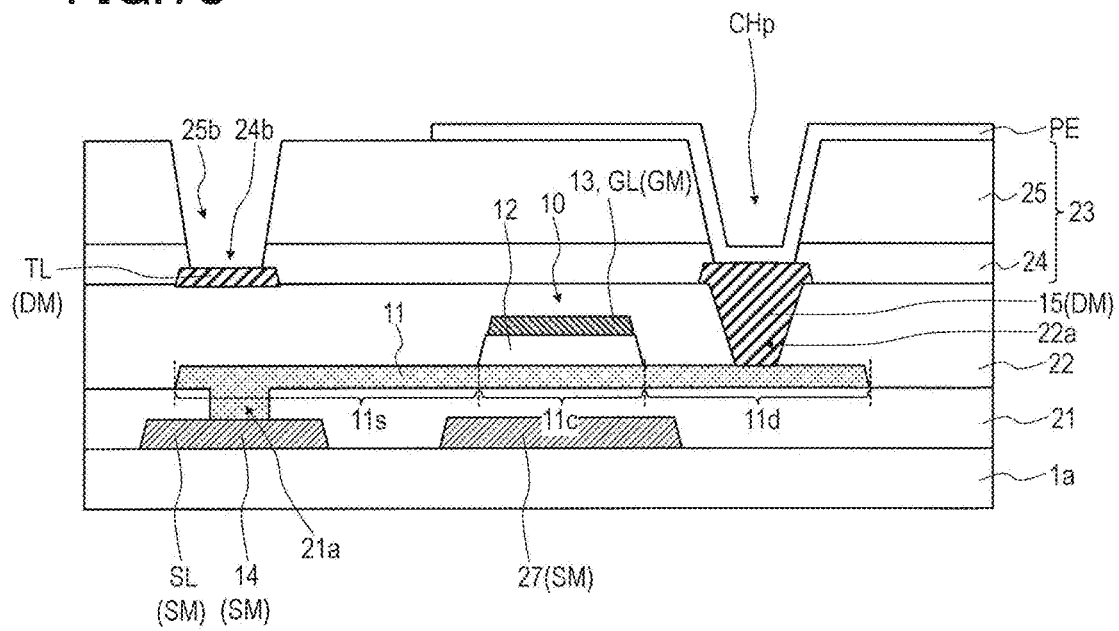
FIG. 7J illustrates a cross-section presenting a step for showing the method for producing the TFT substrate 1.

After that, as illustrated in FIG. 7J, the pixel electrode PE is formed on the inter-layer insulating layer 23. Specifically, first, a first transparent conductive film is formed on the inter-layer insulating layer 23 by, for example, spattering. The first transparent conductive film can be made of such a material as a metal oxide including, for example, an indium-tin oxide (ITO), an indium-zinc oxide, and ZnO. Here, formed as the first transparent conductive film is an indium-zinc oxide film having a thickness of 20 to 300 nm. After that, using photolithography, the first transparent conductive film is patterned (by wet etching, for example) to form the pixel electrode PE.

Figure 7K:
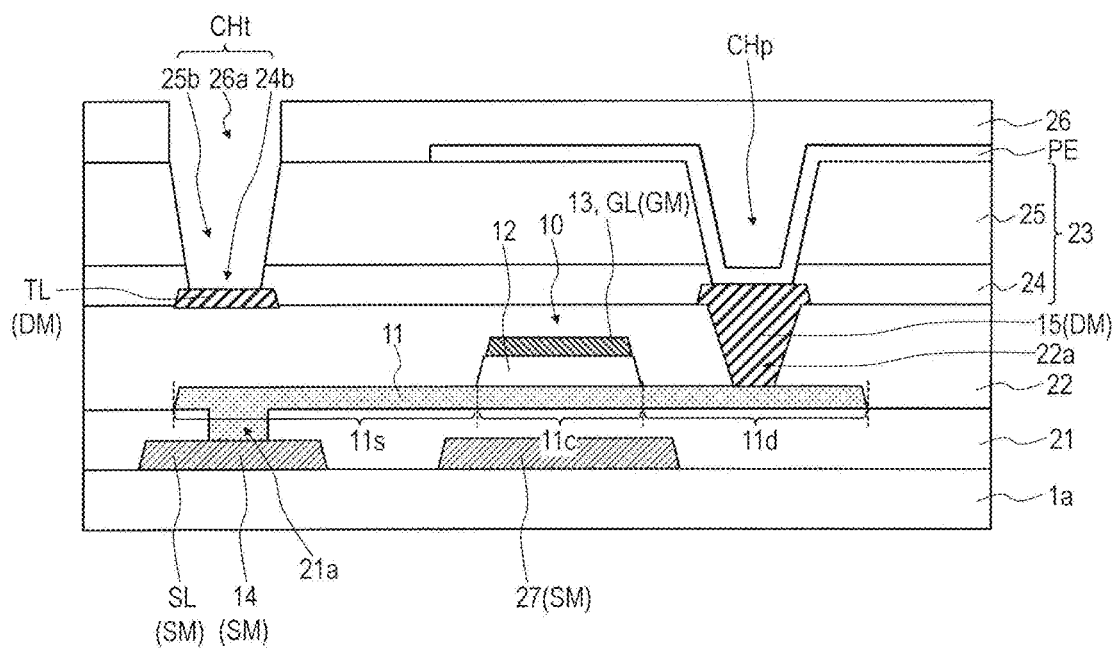
FIG. 7K illustrates a cross-section presenting a step for showing the method for producing the TFT substrate 1.

Next, as illustrated in FIG. 7K, the dielectric layer 26 is formed to cover the pixel electrode PE. The dielectric layer 26 may be made of the same material, described by an example, as the inorganic insulating layer 24 is made of. Here, formed as the dielectric layer 26 by the CVD is an SiN film having a thickness of 50 to 500 nm. After that, the dielectric layer 26 is etched to form the opening 26a overlapping with the touch line TL. The opening 26a of the dielectric layer 26, the second opening 25b of the organic insulating layer 25, and the second opening 24b of the inorganic insulating layer 24 constitute the touch line contact hole CHt.

After that, the common electrode CE is formed on the dielectric layer 26. Hence, the TFT substrate 1 illustrated in FIG. 4 is obtained. Specifically, in forming the common electrode CE, first, a second transparent conductive film is formed on the dielectric layer 26 by, for example, spattering. The second transparent conductive film may be made of the same material, described by an example, as the first transparent conductive film is made of. Here, formed as the second transparent conductive film is an indium-zinc oxide film having a thickness of 20 to 300 nm. After that, the second transparent conductive film is patterned by photolithography (e.g., wet etching) to form the common electrode CE.

[Oxide Semiconductor]

The oxide semiconductor included in the oxide semiconductor layer 11 may be an amorphous oxide semiconductor, or a crystalline oxide semiconductor including a crystalline substance. Examples of the crystalline oxide semiconductor include a polycrystalline oxide semiconductor, a microcrystalline oxide semiconductor, and a crystalline oxide semiconductor in which a c-axis is oriented substantially perpendicular to a plane of a layer.

The oxide semiconductor layer 11 may have a multi-layered structure with two layers or more. When multi-layered, the oxide semiconductor layer 11 may include a non-crystalline oxide semiconductor layer and a crystalline oxide semiconductor layer. Alternately, the oxide semiconductor layer 11 may include a plurality of crystalline oxide semiconductor layers each having a different crystalline structure. Moreover, the oxide semiconductor layer 11 may include a plurality of non-crystalline oxide semiconductor layers. If the oxide semiconductor layer 11 has a double-layered structure including an upper layer and a lower layer, the oxide semiconductor included in the upper layer is larger in energy gap than that included in the lower layer. Note that if the difference between the energy gaps in these layers is relatively small, the oxide semiconductor of the lower layer may be larger in energy gap than that of the upper layer.

Materials of, structures of, and methods for forming a film of the non-crystalline oxide semiconductor and each crystalline oxide semiconductor, as well as configurations of the oxide semiconductor layer having a multi-layered structure are described in, for example, Japanese Unexamined Patent Application Publication No. 2014-007399. For reference, all the contents disclosed in Japanese Unexamined Patent Application Publication No. 2014-007399 are incorporated in this Specification.

The oxide semiconductor layer 11 may include at least one metal element among, for example, In, Ga and Zn. In this embodiment, the oxide semiconductor layer 11 includes, for example, an In—Ga—Zn—O-based semiconductor (e.g., indium gallium zinc oxide). Here, the In—Ga—Zn—O-based semiconductor is a ternary oxide including In (indium), Ga (gallium), and Zn (zinc). The ratio (proportion) of In, Ga, and Zn is not limited to a particular one. Examples of the ratio include In:Ga:Zn=2:2:1, In:Ga:Zn=1:1:1, and In:Ga:Zn=1:1:2. Such an oxide semiconductor layer 7 can be formed of an oxide semiconductor film including the In—Ga—Zn—O-based semiconductor.

The In—Ga—Zn—O-based semiconductor may be amorphous or crystalline substance. A crystalline In—Ga—Zn—O-based semiconductor may preferably have a c-axis oriented substantially perpendicular to a plane of a layer.

Note that a crystal structure of the crystalline In—Ga—Zn—O-based semiconductor is disclosed in, for example, the above Japanese Unexamined Patent Application Publication Nos. 2014-007399, 2012-134475, and 2014-209727. For reference, all the contents disclosed in Japanese Unexamined Patent Application Publication Nos. 2012-134475 and 2014-209727 are incorporated in this Specification. A TFT including the In—Ga—Zn—O-based semiconductor layer has a high mobility (twenty times as high as the mobility of a-SiTFT or higher) and a low leakage current (lower than one-hundredth of the leakage current of a-SiTFT). Hence, the TFT including the In—Ga—Zn—O-based semiconductor layer is preferably used for a driving TFT (e.g. a TFT included in a driving circuit placed around a display area including a plurality of pixels and provided on the same substrate as the display area is), and a pixel TFT (a TFT provided to a pixel).

The oxide semiconductor layer 7 may include another oxide semiconductor instead of the In—Ga—Zn—O-based semiconductor. For example, the oxide semiconductor layer 7 may include an In—Sn—Zn—O-based semiconductor (e.g., $In_2O_3$—$SnO_2$—ZnO; InSnZnO). The In—Sn—Zn—O-based semiconductor is a ternary oxide including In (indium), Sn (tin), and Zn (zinc). Alternatively, the oxide semiconductor layer 7 may include: an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, and an In—Ga—Zn—Sn—O-based semiconductor.

The embodiment of the present invention can provide an active matrix substrate including a touch sensor line. In producing the active matrix substrate, an increase in the number of photomasks to be required is curbed. The embodiment of the present invention can also provide a liquid crystal display device including the active matrix substrate and having a touch sensor. The embodiment of the present invention may be suitably applicable to an active matrix substrate including an oxide semiconductor TFT.

While there have been described what are at present considered to be certain embodiments of the invention, it will be understood that various modifications may be made

What is claimed is:

1. An active matrix substrate including a plurality of pixel regions, the active matrix substrate comprising:
   a substrate;
   a source metal layer provided on the substrate and including a plurality of source bus lines;
   a lower insulating layer covering the source metal layer;
   an oxide semiconductor TFT provided to each of the pixel regions, and including: an oxide semiconductor layer provided on the lower insulating layer; a gate insulating layer provided on the oxide semiconductor layer; a gate electrode provided across the gate insulating layer from the oxide semiconductor layer; and a source electrode and a drain electrode electrically connected to the oxide semiconductor layer,
   an inter-layer insulating layer covering the oxide semiconductor TFT;
   a pixel electrode provided on the inter-layer insulating layer and electrically connected to the drain electrode in each of the pixel regions;
   a common electrode provided across a dielectric layer from the pixel electrode, and including a plurality of sub common electrodes each of which is capable of functioning as a touch sensor electrode;
   a gate metal layer including a plurality of gate bus lines and the gate electrode;
   a drain metal layer including the drain electrode in each of the pixel regions; and
   a plurality of touch sensor lines included in the drain metal layer and each electrically connected to a corresponding one of the sub common electrodes, wherein
   the dielectric layer is provided on the pixel electrode, and the common electrode is provided on the dielectric layer.

2. The active matrix substrate according to claim 1, wherein
   each of the touch sensor lines is connected to a corresponding one of the sub common electrodes through a contact hole formed in the dielectric layer and the inter-layer insulating layer.

3. The active matrix substrate according to claim 1 further comprising
   an upper insulating layer covering the oxide semiconductor layer and the gate metal layer, wherein
   the touch sensor lines are provided on the upper insulating layer.

4. The active matrix substrate according to claim 1, wherein
   each of the touch sensor lines overlaps with a corresponding one of the source bus lines when observed in a normal direction of the substrate.

5. The active matrix substrate according to claim 1, wherein
   the source electrode included in the oxide semiconductor TFT in each of the pixel regions is integrally formed with a corresponding one of the source bus lines.

6. The active matrix substrate according to claim 1, wherein
   the source metal layer includes a light-blocking layer overlapping with a channel region of the oxide semiconductor layer when observed in a normal direction of the substrate.

7. The active matrix substrate according to claim 1, wherein
   the oxide semiconductor layer includes an In—Ga—Zn—O-based semiconductor.

8. The active matrix substrate according to claim 7, wherein
   the In—Ga—Zn—O-based semiconductor includes a crystalline substance.

9. A liquid crystal display device with a touch sensor, the liquid crystal display device comprising:
   the active matrix substrate according to claim 1;
   a counter substrate facing the active matrix substrate; and
   a liquid crystal layer provided between the active matrix substrate and the counter substrate.

10. An active matrix substrate including a plurality of pixel regions, the active matrix substrate comprising:
    a substrate;
    a source metal layer provided on the substrate and including a plurality of source bus lines;
    a lower insulating layer covering the source metal layer;
    an oxide semiconductor TFT provided to each of the pixel regions, and including: an oxide semiconductor layer provided on the lower insulating layer; a gate insulating layer provided on the oxide semiconductor layer; a gate electrode provided across the gate insulating layer from the oxide semiconductor layer; and a source electrode and a drain electrode electrically connected to the oxide semiconductor layer,
    an inter-layer insulating layer covering the oxide semiconductor TFT;
    a pixel electrode provided on the inter-layer insulating layer and electrically connected to the drain electrode in each of the pixel regions;
    a common electrode provided across a dielectric layer from the pixel electrode, and including a plurality of sub common electrodes each of which is capable of functioning as a touch sensor electrode;
    a gate metal layer including a plurality of gate bus lines and the gate electrode;
    a drain metal layer including the drain electrode in each of the pixel regions; and
    a plurality of touch sensor lines included in the drain metal layer and each electrically connected to a corresponding one of the sub common electrodes, wherein
    the source metal layer includes a light-blocking layer overlapping with a channel region of the oxide semiconductor layer when observed in a normal direction of the substrate.

11. The active matrix substrate according to claim 10, wherein
    the dielectric layer is provided on the pixel electrode, and the common electrode is provided on the dielectric layer.

12. The active matrix substrate according to claim 10, wherein
    each of the touch sensor lines is connected to a corresponding one of the sub common electrodes through a contact hole formed in the dielectric layer and the inter-layer insulating layer.

13. The active matrix substrate according to claim 10, further comprising
    an upper insulating layer covering the oxide semiconductor layer and the gate metal layer, wherein
    the touch sensor lines are provided on the upper insulating layer.

14. The active matrix substrate according to claim 10, wherein
    each of the touch sensor lines overlaps with a corresponding one of the source bus lines when observed in a normal direction of the substrate.

15. The active matrix substrate according to claim 10, wherein
the source electrode included in the oxide semiconductor TFT in each of the pixel regions is integrally formed with a corresponding one of the source bus lines.

16. The active matrix substrate according to claim 10, wherein
the oxide semiconductor layer includes an In—Ga—Zn—O-based semiconductor.

17. The active matrix substrate according to claim 16, wherein
the In—Ga—Zn—O-based semiconductor includes a crystalline substance.

18. A liquid crystal display device with a touch sensor, the liquid crystal display device comprising:
the active matrix substrate according to claim 10;
a counter substrate facing the active matrix substrate; and
a liquid crystal layer provided between the active matrix substrate and the counter substrate.

\* \* \* \* \*